United States Patent
Pinos et al.

(10) Patent No.: US 12,471,432 B2
(45) Date of Patent: Nov. 11, 2025

(54) VOLTAGE-CONTROLLABLE MONOLITHIC NATIVE RGB ARRAYS

(71) Applicant: Plessey Semiconductors Ltd, Plymouth (GB)

(72) Inventors: Andrea Pinos, Plymouth (GB); Wei Sin Tan, Plymouth (GB); Samir Mezouari, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 308 days.

(21) Appl. No.: 18/038,091

(22) PCT Filed: Nov. 24, 2021

(86) PCT No.: PCT/GB2021/053035
§ 371 (c)(1),
(2) Date: May 22, 2023

(87) PCT Pub. No.: WO2022/112750
PCT Pub. Date: Jun. 2, 2022

(65) Prior Publication Data
US 2024/0006460 A1    Jan. 4, 2024

(30) Foreign Application Priority Data
Nov. 30, 2020    (GB) ...................................... 2018794

(51) Int. Cl.
*H10H 29/14*    (2025.01)
(52) U.S. Cl.
CPC ................ *H10H 29/142* (2025.01)
(58) Field of Classification Search
None
See application file for complete search history.

(56) References Cited

U.S. PATENT DOCUMENTS

| | | | |
|---|---|---|---|
| 5,920,078 A | 7/1999 | Frey | |
| 8,058,663 B2 * | 11/2011 | Fan | ........................ H10H 29/10 257/89 |

(Continued)

FOREIGN PATENT DOCUMENTS

| | | |
|---|---|---|
| EP | 0345626 A2 | 12/1989 |
| JP | S601874 A | 1/1985 |

(Continued)

OTHER PUBLICATIONS

International Search Report and Written Opinion in PCT International Application No. PCT/GB2021/053035 mailed Mar. 1, 2022.

(Continued)

*Primary Examiner* — Bilkis Jahan
(74) *Attorney, Agent, or Firm* — Cognition IP, P.C.; Edward Steakley

(57) ABSTRACT

A light emitting diode structure comprising: a p-type region; an n-type region; a gate contact; a first light emitting region for recombination of carriers injectable by the p-type region and the n-type region; and a second light emitting region for recombination of carriers injectable by the p-type region and the n-type region, wherein the first light emitting region and the second light emitting region at least partially overlap to form a light emitting surface associated with the first light emitting region and the second light emitting region; wherein the p-type region is at least partially formed in a first channel through the first light emitting region and the second light emitting region, and the n-type region is at least partially formed in a second channel through the first light emitting region and the second light emitting region, wherein the light emitting device is configured such that the wavelength of light emitted by the light emitting surface is controllable by varying a gate voltage applied to one of the p-type and n-type regions by the gate contact thereby to alter (Continued)

carrier injection by the p-type and n-type regions into the first and second light emitting regions.

25 Claims, 8 Drawing Sheets

(56) References Cited

U.S. PATENT DOCUMENTS

| | | | |
|---|---|---|---|
| 8,163,581 B1* | 4/2012 | Or-Bach | H10F 39/8023 |
| | | | 438/93 |
| 2009/0078955 A1* | 3/2009 | Fan | H10H 29/10 |
| | | | 438/46 |
| 2009/0273293 A1 | 11/2009 | Bratkovski et al. | |
| 2012/0231572 A1 | 9/2012 | Or-Bach et al. | |
| 2015/0060904 A1 | 3/2015 | Robin et al. | |
| 2016/0270176 A1 | 9/2016 | Robin et al. | |
| 2019/0198709 A1* | 6/2019 | Wildeson | H05B 47/195 |
| 2020/0091371 A1 | 3/2020 | Atanackovic | |
| 2020/0350359 A1 | 11/2020 | Hirmer et al. | |

FOREIGN PATENT DOCUMENTS

| | | |
|---|---|---|
| JP | H11503879 A | 3/1999 |
| JP | 2015526833 A | 9/2015 |
| JP | 2019522363 A | 8/2019 |
| JP | 2019161172 A | 9/2019 |
| JP | 2021506107 A | 2/2021 |
| JP | 2021508175 A | 2/2021 |
| JP | 7645275 B2 | 3/2025 |
| WO | 2009128777 A1 | 10/2009 |
| WO | 2013164659 A1 | 11/2013 |
| WO | 2020120692 A1 | 6/2020 |
| WO | 2020121904 A1 | 11/2021 |

OTHER PUBLICATIONS

Patents Act 1977: Search Report Under Section 17 in GB application No. GB2018794.4 mailed Jun. 1, 2021.
1st Examination Report Received in Taiwanese Application No. 110144674, mailed on Jul. 18, 2023.
International Preliminary Report on Patentability in PCT International Application No. PCT/GB2021/053035 mailed Jun. 15, 2023.

* cited by examiner

VOLTAGE-CONTROLLABLE MONOLITHIC NATIVE RGB ARRAYS

CROSS-REFERENCE TO RELATED APPLICATIONS

This application is a 35 U.S.C. § 371 U.S. National Stage application of International Application No. PCT/GB2021/053035, filed on Nov. 24, 2021, which claims the benefit of priority of Great Britain application 2018794.4, filed on Nov. 30, 2020, which are incorporated herein by reference in their entirety.

FIELD OF THE INVENTION

The invention relates to light emitting diode (LED) device structures and methods of forming light emitting diode device structures. In particular, but not exclusively, the invention relates to voltage controllable wavelength of light emission from native LED devices.

BACKGROUND OF THE INVENTION

Conventional red-green-blue (RGB) micro light emitting diode (μLED) arrays of light emitting pixels are typically achieved using pick-and-place techniques, or by the use of colour conversion material deposited or integrated into standard planar light emitting diode (LED) structures. However, as the pixel pitch in such arrays is reduced to very small pitches (e.g., less than 5 μm) in order to provide higher resolution arrays, a number of difficulties arise.

For example, the use of pick-and-place can be impractical due to high cost, low throughput and the limit of positional accuracy when transferring the μLEDs. In the case of colour conversion, the use of such a technique is limited by the phosphor size used for colour conversion, which is typically greater than 10 μm (i.e., greater than the pixel pitch in arrays with very small pitches used for higher resolutions). Further, colour conversion techniques may be subject to poor reliability and inefficiencies due to small absorption coefficients associated with quantum dots (QDs). For example, thicknesses of colour-converting QD material in excess of 10 μm are used fully to absorb the blue emission exciting them, thus making them unsuitable for very small pixel pitch arrays.

In order to avoid having to transfer LEDs, and in order to provide high-quality efficient emission, it would be beneficial to provide a native array of LEDs on the same substrate. One approach for building a native array of LEDs on the same substrate relies on selective area growth of nanowires, which are arrays of individual structures that are grown substantially perpendicular to a patterned growth substrate to form light emitting structures where the light emitting surface is defined by the cross-sectional area of the nanowire using typical epitaxial quantum well structures grown between epitaxial n-type and p-type doped layers. However, the growth of such nanowires is generally difficult to control and may be subject to severe limitations in the light efficiency and colour gamut achievable due to poor light extraction efficiency and impurity incorporation, for example.

SUMMARY OF THE INVENTION

In order to mitigate for at least some of the above described problems, there is provided a light emitting diode structure comprising: a p-type region; an n-type region; a gate contact; a first light emitting region for recombination of carriers injectable by the p-type region and the n-type region; and a second light emitting region for recombination of carriers injectable by the p-type region and the n-type region, wherein the first light emitting region and the second light emitting region at least partially overlap to form a light emitting surface associated with the first light emitting region and the second light emitting region; wherein the p-type region is at least partially formed in a first channel through the first light emitting region and the second light emitting region, and the n-type region is at least partially formed in a second channel through the first light emitting region and the second light emitting region, wherein the light emitting device is configured such that the wavelength of light emitted by the light emitting surface is controllable by varying a gate voltage applied to one of the p-type and n-type regions by the gate contact thereby to alter carrier injection by the p-type and n-type regions into the first and second light emitting regions.

There is also provided a method of forming a light emitting diode structure comprising: a p-type region; an n-type region; a gate contact; a first light emitting region for recombination of carriers injectable by the p-type region and the n-type region; and a second light emitting region for recombination of carriers injectable by the p-type region and the n-type region, wherein the first light emitting region and the second light emitting region at least partially overlap to form a light emitting surface associated with the first light emitting region and the second light emitting region, the method comprising at least partially forming the p-type region in a first channel through the first light emitting region and the second light emitting region and at least partially forming the n-type region in a second channel through the first light emitting region and the second light emitting region, wherein the light emitting device is configured such that the wavelength of light emitted by the light emitting surface is controllable by varying a gate voltage applied to at least one of the p-type and n-type regions by the gate contact thereby to alter carrier injection by the p-type and n-type regions into the first and second light emitting regions.

Advantageously, sequences of monolithically grown native GaN-based light emitting structures allow for improved use of space in arrays, as the light emitting regions are effectively stacked rather than side by side. Beneficially, compared with colour converted pixels, native colours can be made as pixels that are smaller, more efficient and more resistant to degradation. Beneficially, compared with pick-and-place assembly, such structures are formed in arrays with a much higher throughput by forming the array on the wafer rather than transferring millions of pixels onto a substrate.

Preferably, the light emitting diode device comprises a third light emitting region that at least partially overlaps the first light emitting region and the second light emitting region to form the light emitting surface, wherein the p-type region is at least partially formed in the first channel through the third light emitting region and the n-type region is at least partially formed in the second channel through the third light emitting region; wherein the light emitting device is configured such that the wavelength of light emitted by the light emitting surface is controllable by varying a gate voltage applied to at least one of the p-type and n-type regions by the gate contact thereby to alter carrier injection by the p-type and n-type regions into the first, second and third light emitting regions. Advantageously, the structure can be used to provide red, green and blue light emission, making structures and arrays formed this way suitable for use in full colour displays, such as high resolution light emitting displays.

Preferably, the first channel or the second channel is a via at least partially defining the perimeter of the light emitting surface. Advantageously, the use of a via at least partially defining the perimeter means that no electrical isolation etch between pixels is required. Beneficially, the cathode grid runs around each pixel which are further preferably isolated top and bottom by undoped material, such as undoped GaN, allowing for tighter pixel integration.

Preferably varying the gate voltage alters the depletion depth in the first channel or second channel. Advantageously, control of the gate voltage enables different wavelengths of light to be emitted from the structure. Such colour control enables multicolour displays to be provided.

Preferably, the light emitting diode device comprises an epitaxial crystalline semiconductor structure, wherein at least one of the first, second and third light emitting regions comprises one or more epitaxial crystalline semiconductor layers, preferably wherein at least one of the first, second and third light emitting regions comprises at least one epitaxial quantum well layer. Advantageously, compared with the formation of light emitting nanowires, a standard planar epitaxial growth/deposition process can be applied for the formation of the MQW which provides higher internal quantum efficiency (IQE).

The planar nature of the device also lends itself to better light extraction using standard surface patterning techniques.

Preferably, wherein p-type region and/or n-type region comprises a planar layer. Advantageously, a planar layer is used simultaneously to provide the basis for subsequent growth as well as a common electrical pathway for use as a common electrode, for example.

Preferably, the gate contact is a ring contact corresponding to a pixel defined by the light emitting surface, preferably wherein the ring contact forms one of a polygon or circular shaped contact. Advantageously, the ring contact enables uniform electrical injection into a light emitting diode structure and therefore even light distribution from an associated pixel.

Preferably, light emitted from the first light emitting region has a different primary peak wavelength compared with light emitted from the second light emitting region. Advantageously, a multicolour output is provided.

Preferably, the first and the second light emitting regions are separated by an undoped region. Advantageously, the undoped region reduces carrier diffusion within the structure.

There is also provided an array of light emitting diode devices comprising a plurality of light emitting diode devices. Advantageously, arrays of light emitting diode devices that each provide multiple wavelength outputs means that high resolution, tightly integrated light emitting diode displays are provided.

Preferably, the array comprises a plurality of pixels, wherein the pixels correspond to light emitting surface areas of light emitting diode devices. Advantageously, full colour emissive displays with small, high density pixels can be provided, thereby to form high resolution displays.

Preferably, the p-type region or the n-type region of at least two of the plurality of light emitting diode devices is shared to form a common electrode. Advantageously, the common electrode is a growth layer that forms part of high quality integrated growth whilst providing increased versatility for electrical connection of structure.

Preferably, the common electrode is on an opposite side of the array to the gate contact. Advantageously, tighter pixel integration can be achieved.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which.

Figure 1A:
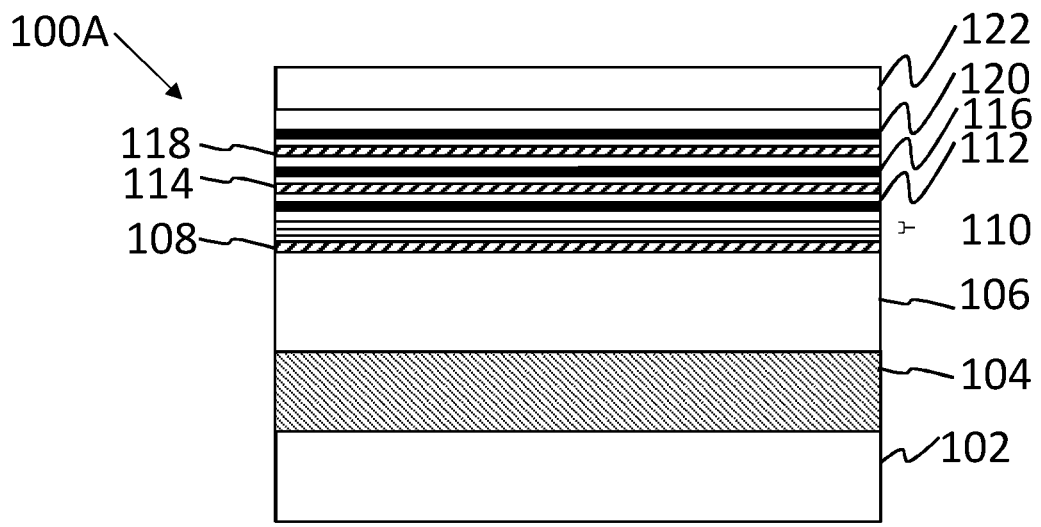
FIG. 1A shows a cross sectional view of an epitaxial structure.

Light emitting diodes (LEDs) are typically formed by processing light emitting structures that have been grown by the formation of epitaxial crystalline layers on relatively large wafer substrates in a reactor, such as an MOCVD (metalorganic chemical vapour deposition) reactor, MBE (molecular beam epitaxy) reactor or other chemical vapour deposition reactor, for example. For the reasons described above, known methods for creating arrays of light emitting devices, such as arrays of high resolution micro-LEDs, face difficulties in processing of LEDs produced by crystalline growth on relatively large wafer substrates to provide micro-LEDs for high resolution arrays. The use of nanowire LED arrays to overcome these processing problems leads to difficulties in control of the growth process as well as generally poorer performance than is seen from conventional relatively large wafer substrate growth of LEDs.

The present disclosure describes LEDs that can be formed as part of a monolithic high resolution array by, advantageously, processing light emitting structures that can be grown on relatively large wafer substrates. Beneficially, compared with colour converted pixels, native colour pixels can be formed that are smaller, more efficient and more resistant to degradation. Compared with pick-and-place assembly, processing of epitaxial structures grown directly on a wafer means that there is no requirement to transfer millions of pixels (and associated failure in the transfer process) and thus there is higher throughput by forming arrays of pixels on wafers. Compared with nanowires, the processing of standard planar epitaxial deposited layer growth means that multiple quantum wells (MQWs) are formed in a way that provides high quality growth and hence relatively high internal quantum efficiency (IQE). Further, the processing of epitaxial structures provides planar devices that better lend themselves to light extraction using standard surface patterning techniques.

Beneficially, as described with reference to FIGS. 1 to 6, epitaxial layer structures are provided where Blue, Green and Red light emitting MQWs are stacked in sequence without the use of any p-type cladding. In an example, n-type GaN grid vias intersecting the MQW region and defining the pixel perimeter are provided by an etching and selective area growth step sequence. P-GaN vias are also provided with a similar step sequence. Electron and hole injection is accomplished by lateral injection straight into the quantum wells (QWs). In an example, a dielectric insulating layer is deposited on the n-type GaN grid via to electrically insulate the n-type GaN grid from a ring gate deposited onto the grid. The sequence of ring metal gate, dielectric and n-type GaN via form a ring metal-insulator-semiconductor field-effect transistor (MIS-FET). The n-type doping in the grid via as well as the thickness of the insulator in the MIS-FET are such that a negative voltage applied between the ring gate contact and the cathode contact, which is in Ohmic contact with the n-type GaN, progressively depletes the n-type grid vias of free electrons. By controlling the gate voltage, current flow can be directed to different depths in the structure thereby energizing MQW at different depth in the structure. Hence, the voltage applied to each of the ring gates can be used to independently tune the colour of the emission from each pixel.

Advantageously, the stacked structure with overlaid light emitting regions associated with different wavelengths of light emission allows for tighter integration of pixels, as three colours can be emitted by the same pixel rather than having independent pixels emitting red, green or blue light placed side-by-side.

Further advantages arising from the described method and structure will be apparent in the following description. Methods of providing arrays of micro LEDs are described below with reference to various processing steps (the processing steps may include steps performed both in a growth reactor and outside a growth reactor, using other processing and/or growth equipment). The methods and structures are described with reference to group III-V semiconductor materials. In particular, the methods and structures are described with reference to Nitride structures, including Gallium Nitride (GaN) based light emitting structures, which are well known to provide relatively high efficiency light emitting structures. However, in further examples, the methods and structures are applicable to light emitting structures based on other materials, in particular based on other compound semiconductor materials, such as other group III-V compound semiconductor materials and group II-VI compound semiconductor materials.

In the following figures, like reference numerals are used in order to illustrate aspects of the structures that relate to the same features, or equivalent features provided by the same, or similar, processes.

FIG. 1A shows a structure 100A that is an epitaxial structure 100A that can form the basis of an LED pixel array. Such an LED pixel array has a plurality of individual pixels, where pixels may be individually addressable based on the way such LED pixel array is connected to a power source (e.g., depending on the arrangement of a backplane with respect to the LED pixel array). The epitaxially grown structure 100A formed from multiple layers defining regions includes an effective stack of natively grown light emitting regions that are configured to emit light with different wavelengths. Appropriate processing of the epitaxially grown structure 100A enables the production of pixels suitable for use in displays, where the pixels have a light emitting surface that emits light of a wavelength that is dependent on appropriate voltage control of the processed light emitting structure.

The structure 100A is a gallium nitride (GaN)-based epitaxial structure comprising multiple quantum wells (MQWs), grown by metalorganic chemical vapour deposition (MOCVD), that is effectively a native LED structure. Beneficially, known techniques can be used to provide high quality material that can be processed in order to provide an LED array.

In FIG. 1A there is shown an n-doped (n-GaN) n-type region 104 upon which an undoped region 106 (GaN that is not intentionally doped) is grown. The n-type region 104 is formed on a substrate 102 and is approximately 500 nm thick with a doping level of $8 \times 10^{18}$ at/cm$^3$. In further examples, the n-type region 104 has a different thickness and/or doping level. The substrate 102 is formed from sapphire. In further examples, alternative and/or additional substrates (such as silicon, or native GaN substrates) are used to provide the basis for epitaxial growth of the structure 100A.

On the undoped region 106 there is grown an undoped aluminium gallium nitride (AlGaN) region. This layer is an AlGaN barrier region 108. A GaN-based superlattice structure 110 is grown upon this first barrier region 108. The superlattice structure is formed in order maintain crystalline quality of subsequently grown layers in view of their composition and strain that is introduced dependent on the thickness and composition of the subsequently grown layers. In an example, the superlattice structure 110 has a twenty times repeated structure of 1.5 nm InGaN (5% Indium composition) and 2.7 nm GaN layers. In further examples, an alternative structure is used and/or the superlattice structure is not included, or included with different layers of different compositions and/or thicknesses.

On top of the superlattice structure 110 there is a light emitting region 112 having multiple quantum wells (MQWs). On top of the light emitting region 112 there is a further barrier layer, which is a second barrier region 114. On top of the second barrier region 114 there is a second light emitting region 116. On top of the second light emitting region 116 there is a layer that provides a third barrier region 118. On top of the third barrier region there is a third light emitting region 120, on top of which there is provided an undoped layer, such as undoped GaN. The structure 100A is terminated with an insulating region provided by a dielectric layer 122. The dielectric layer 122 is an Al$_2$O$_3$ layer with a thickness of approximately 10 nm. In further examples the dielectric layer 122 is formed with a different thickness and/or material whilst providing the required insulating properties. In further examples, additional and/or alternative layers and/or materials are used in the epitaxial structure 100A.

The n-type region 104, the undoped region 106, the first barrier region 108, the superlattice 110, the light emitting region 112, the second barrier region 114, the second light emitting region 116, the third barrier region 118, the third light emitting region 120 and the dielectric layer 122 are shown in cross-section as a plurality of epitaxial layers grown on a substrate. In further examples, alternative and/or additional methods are used to form the structure 100A, for example, the dielectric layer 122 is in a further example deposited on an otherwise epitaxially grown compound crystalline structure.

The light emitting regions 112, 116, 120 are grown in an appropriate sequence depending on the final orientation of the light emitting device and its associated light emitting surface. Where light is to be extracted through the n-type region 104 of the structure described in FIG. 1A as illustrated with respect to FIG. 1F), the first light emitting region 112 is configured to emit light with a primary peak wavelength corresponding to blue light, the second light emitting region 116 is configured to emit light with a primary peak wavelength corresponding to green light and the third light emitting region 120 is configured to emit light with a primary peak wavelength corresponding to red light. This means that when the structure is reversed, longer wavelength light will pass through the structure without being absorbed by subsequent light emitting regions (as, for example, blue light would otherwise be absorbed in green and red light emitting quantum wells and green light would be absorbed in red light emitting quantum wells).

The first light emitting region 112 has MQWs. Additionally or alternatively, the light emitting region 112 may have a single quantum well (SQW). Additionally or alternatively, the light emitting region 112 may include one or more quantum dots or other structure to enable carrier combination and light emission. The quantum wells and quantum dots confine carriers and, in use, provide a source of light based on emissive carrier recombination in the quantum structures following carrier injection, for example by n-type and p-type regions when connected to a cathode and an anode, respectively. The light emitting region 112 is configured to emit light with a primary peak wavelength corresponding to blue light (approximately 450 nm). In an example, the first light emitting region 112 is formed with one or more quantum wells of 3 nm in thickness and InGaN with a composition of 20% Indium. In further examples, different numbers, thicknesses and compositions of quantum wells are used.

The second light emitting region 116 has MQWs. Additionally or alternatively, the second light emitting region 116 may have a single quantum well (SQW). Additionally or alternatively, the second light emitting region 116 may include one or more quantum dots or other structure to enable carrier combination and light emission. The quantum wells and quantum dots confine carriers and, in use, provide a source of light based on emissive carrier recombination in the quantum structures following carrier injection, for example by n-type and p-type regions when connected to a cathode and an anode, respectively. The second light emitting region 116 is configured to emit light with a primary peak wavelength corresponding to green light (approximately 520 nm). In an example, the second light emitting region 116 is formed with one or more quantum wells of 3 nm in thickness and InGaN with a composition of 30% Indium. In further examples, different numbers, thicknesses and compositions of quantum wells are used.

The third light emitting region 120 has MQWs. Additionally or alternatively, the third light emitting region 120 may have a single quantum well (SQW). Additionally or alternatively, the third light emitting region 120 may include one or more quantum dots or other structure to enable carrier combination and light emission. The quantum wells and quantum dots confine carriers and, in use, provide a source of light based on emissive carrier recombination in the quantum structures following carrier injection, for example by n-type and p-type regions when connected to a cathode and an anode, respectively. The third light emitting region 120 is configured to emit light with a primary peak wavelength corresponding to red light (approximately 620 nm). In an example, the third light emitting region 120 is formed with one or more quantum wells of 3 nm in thickness and InGaN with a composition of 40% Indium. In further examples, different numbers, thicknesses and compositions of quantum wells are used.

In the structure 100A, the quantum wells are separated by 3 nm of undoped GaN. The quantum wells and the barrier layers are separated by 3 nm of undoped GaN. In further examples, different thicknesses and materials are used in the structure 100A whilst preserving at least some of the functionality described herein.

A first barrier region 108, which is an undoped AlGaN barrier region 108 prevents carrier diffusion away from the first light emitting region 112. The first barrier region 108 has a thickness of 20 nm and a composition of AlGaN with 20% aluminium. In further examples, the first barrier region 108 has a different thickness and/or composition and/or is formed from a different material whilst providing suitable electron blocking properties and enabling high quality crystalline growth. Whilst the first barrier region 108 is show to be an AlGaN barrier region 108, additionally or alternatively, the barrier region 108 is formed from a different material.

A second barrier region 114, which is an undoped AlGaN barrier region 114 prevents carrier diffusion between the first light emitting region 112 and the second light emitting region 116. The second barrier region 114 has a thickness of 20 nm and a composition of AlGaN with 20% Aluminium. In further examples, the second barrier region 114 has a different thickness and/or composition and/or is formed from a different material whilst providing suitable electron blocking properties and enabling high quality crystalline growth. Whilst the second barrier region 114 is show to be an AlGaN barrier region 114, additionally or alternatively, the barrier region 114 is formed from a different material.

A third barrier region 118, which is an undoped AlGaN barrier region 118 prevents carrier diffusion between the second light emitting region 116 and the third light emitting region 120. The third barrier region 118 has a thickness of 20 nm and a composition of AlGaN with 20% Aluminium. In further examples, the third barrier region 118 has a different thickness and/or composition and/or is formed from a different material whilst providing suitable electron blocking properties and enabling high quality crystalline growth. Whilst the third barrier region 118 is show to be an AlGaN barrier region 118, additionally or alternatively, the barrier region 118 is formed from a different material.

Whilst the light emitting regions 112, 116, 120 comprises MQWs, in further examples, the light emitting regions 112, 116, 120 may have a single quantum well (SQW). The light emitting regions 112, 116, 120 comprises multiple layers of material to form an active region. For example, the light emitting regions 112, 116, 120 comprises layers such as a short period superlattice and/or an undoped recovery layer, thereby providing high quality crystalline material and emission from the light emitting regions 112, 116, 120. Additionally or alternatively, the light emitting regions 112, 116, 120 may include one or more quantum dots. The quantum wells and quantum dots confine carriers and, in use, provide a source of light based on carrier recombination in the quantum structures following carrier injection by n-type and p-type regions when connected to a cathode and an anode, respectively.

Whilst the n-type region 104 is typically formed on a substrate 102, alternatively, the n-type region 104 may itself be a free-standing substrate suitable for the growth of subsequent crystalline layers. In an example, the substrate 102 is a sapphire substrate. In further examples alternative substrates are used, such as a silicon substrate, or GaN substrate.

The epitaxial structure 100A is grown using an MOCVD reactor. Advantageously, such a structure 100A can be optimised for MOCVD growth and provide high quality growth for efficient generation of light. Additionally or alternatively, other deposition and/or growth methods may be used to provide the epitaxial structure 100A, such as molecular beam epitaxy (MBE).

The n-type region 104 is formed from n-type gallium nitride. However, in further examples the n-type region 104 may be formed from and/or based on other material, such as other semiconductor materials, for example other III-V compound semiconductor materials, II-VI compound semiconductor materials or other appropriate materials.

The barrier regions 108, 114, 118 are formed from aluminium gallium nitride, for example 20% aluminium AlGaN. However, in further examples, additionally or alternatively, the barrier regions 108, 114, 118 may be formed from different materials, such as other semiconductor materials, for example other III-V compound semiconductor materials, II-VI compound semiconductor materials or other appropriate materials. The superlattice 110 is formed from gallium nitride based materials. Additionally or alternatively, the superlattice 110 is formed from other materials, such as other semiconductor materials, for example other III-V compound semiconductor materials, II-VI compound semiconductor materials or other appropriate materials.

The light emitting regions 112, 116, 120 each comprise at least one quantum well. Additionally or alternatively, light emitting regions 112, 116, 120 each comprise further quantum wells. Additionally or alternatively, light emitting regions 112, 116, 120 comprise quantum dots or other quantum structures. The light emitting regions 112, 116, 120 are gallium nitride based regions whereby the at least quantum well in each light emitting region 112, 116, 120 is formed from a gallium nitride based material such as indium gallium nitride (InGaN), or aluminium indium gallium nitride (AlINGaN). Additionally or alternatively, different materials are used, depending on the structure that is to be grown, such as other semiconductor materials, for example other III-V compound semiconductor materials, II-VI compound semiconductor materials or other appropriate materials. The composition of quantum wells in the light emitting regions 112, 116, 120 is determined based on the primary peak wavelength that is selected for emission from the light emitting regions 112, 116, 120. Whilst three light emitting regions 112, 116, 120 are shown in the Figures, in further examples, different numbers of light emitting regions are implemented. For example, there may be two light emitting regions and the structure 100A is adapted accordingly.

The light emitting regions 112, 116, 120 do not contain any doping, for example, they do not contain silicon doping or magnesium doping through intentional doping of the light emitting regions 112, 116, 120 during the growth of the structure 100A. In further examples, doping is used in the light emitting regions 112, 116, 120 to the extent that it does not affect the carrier injection in order to emit light via the light emitting surface of a pixel defined by vias passing through the light emitting regions 112, 116, 120, as described herein. In further examples, different semiconductor layers are formed, by growth or otherwise in order to provide the base structure for processing monolithic arrays of micro LEDs.

Whilst a particular epitaxial structure 100A is shown at FIG. 1A, the skilled person understands that additional layers, the exclusion of layers and alternative layers may be used in order to implement the concepts described herein, depending on the particular needs of the specific implementation. The description of layers formed on top of other layers indicates a positional relation in respect of the order of the growth of the layers and does not necessarily preclude the presence of layers in between a first layer and a second layer that is described as being on top of the first layer.

Once the epitaxial structure 100A has been provided, it can be processed in order to provide conducting regions through which carriers can be injected into the eventual structure.

Figure 1B:
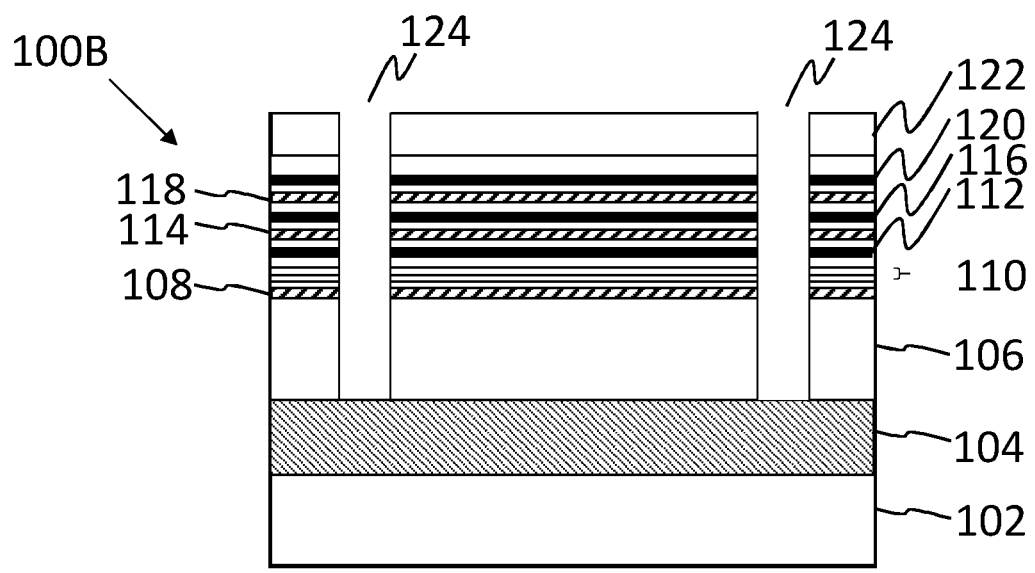
FIG. 1B shows a cross sectional view of the epitaxial structure of FIG. 1A that has been processed further.

Accordingly, FIG. 1B shows a processed epitaxial structure 100B. There is shown the epitaxial structure 100A of FIG. 1A, with channels 124 formed through the epitaxial structure to enable contact with the n-type region 104. The channels 124 are formed using a mask layer. The mask layer (not shown) is formed and processed using known techniques, including lithographical techniques, in order selectively to create apertures and expose portions of the underlying epitaxial structure 100A, for example the dielectric layer 122. Once portions of the mask layer have been selectively removed, selective etching of the underlying epitaxial structure 100A is performed. Such selective etching provides channels 124 in the epitaxial structure 100A. The channels, 124, also described as vias 124, are created by removal of material in order to leave pathways through the remaining material. Depending on the shape of the area exposed in the mask layer and the depth of the etching, the channels/vias that are formed will have a corresponding form which, in an example, is that of a trench via or a columnar via. Whilst channels/vias 124 are created by etching material to leave trenches, holes or other pathways, in further examples, channels 124/vias 124 are additionally or alternatively created by forming materials such that the absence of material, as opposed to the removal of material, creates the via structures within the other structures.

In an example the mask layer is silicon nitride. Additionally or alternatively, different material is used, such as silicon dioxide. Advantageously, silicon nitride is an effective and controllable mask layer for subsequent processing steps.

The channels/vias 124 are shown to have been etched through the epitaxial structure 100A to the n-type region 104. Advantageously, this means that subsequently deposited n-type material in the channels/vias 124 can be contacted by the n-type region 104 on one side of the device, as well as by the n-type region formed in the channel/via 124. This enables the provision of a gate contact and a cathode contact, as described herein.

In order to etch the channels/vias 124, lithographical techniques are used in order to pattern a mask layer and to open apertures in the mask layer to enable the etching of the material exposed by the apertures formed in the mask. The channels/vias 124 are shown in cross-section. In plan view the channels/vias 124 are formed in a grid structure, in order to define pixels, where the channels/vias 124 define the perimeter of a light emitting surface of each individual pixel by passing through the light emitting regions 112, 116, 120 in order to form a trench channel/via 124 isolating each individual pixel. In an example, the channels/vias 124 are formed using dry etching techniques, such as plasma based techniques. Preferably, wet etch treatment is used in order to recover any damage caused by the etching of the channels/vias 124. Additionally or alternatively, any suitable etching technique is used in order to form channels/vias 124.

Figure 1C:
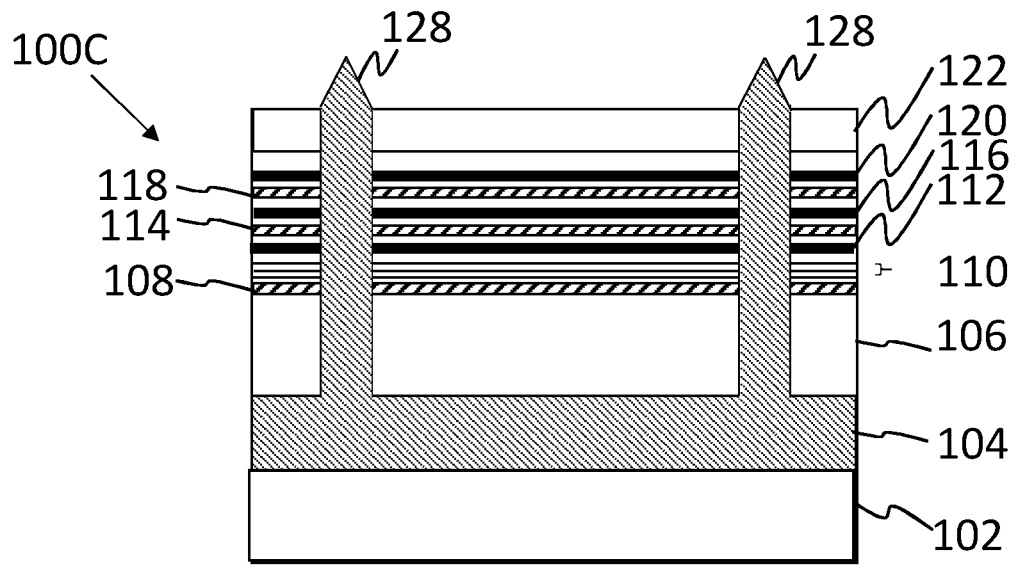
FIG. 1C shows a cross sectional view of the epitaxial structure of FIG. 1B that has been processed further.

FIG. 1C shows a further processed epitaxial structure 100C, with channels 124 that have been etched through the epitaxial structure 100A and subsequently overgrown to form n-type regions passing through the light emitting regions 112, 116, 120.

Once the channels/vias 124 have been formed in the epitaxial structure 100A, selective overgrowth of n-type material is formed. Such overgrowth, or deposition, of material in channels/vias 124 can be made with the mask layer used to enable etching of the channels/vias 124 remaining in place, such that no growth occurs on the dielectric layer 122, for example. FIG. 1C shows the same basic structure 100C as shown in the epitaxial structures 100A, 100B of FIGS. 1A and 1B, however, the structure 100C of FIG. 1C is shown to have been processed further. The processed epitaxial structure 100C of FIG. 1C illustrates the structure that has been etched through in order to provide channels/vias 124, as shown in FIGS. 1A and 1B. The channels/vias 124 have been vertically etched through the epitaxial structure 100A to the doped n-type region 104. Subsequently, n-type overgrowth 128 of n-doped GaN (n-GaN) has been formed in the channels/vias 124 to provide a conducting region that passes through the light emitting regions 112, 116, 120.

Whilst a the lateral distance between the channels/vias 124 (and accordingly the n-type overgrowth 128) of FIG. 1C relates to a single pixel cross section, it is understood that selective etching of the epitaxial structure 100A and overgrowth of n-type material in via trenches provided by the selective etching will result in an n-type grid that is a effectively a common electrode (in this case a cathode) for all of the pixels defined by the n-type overgrowth 128 passing through the light emitting regions 112, 116, 120 of the epitaxial structure 100C. Advantageously, selective area growth of n-type material is performed using a metalorganic chemical vapour deposition (MOCVD) reactor that uses relatively high temperatures. Such relatively high temperatures anneal defects and passivate any open MQW surface. No dangling bonds in the MQW perimeter are left after processing and hence no passivation is needed. Therefore, beneficially, much reduced non-radiative recombination is achieved in the light emitting regions 112, 116, 120. In further examples, n-type overgrowth is performed using a different techniques, such as MBE.

The n-type overgrowth 128 is shown to be proud of the surface of the dielectric layer 122. Advantageously, this enables contacting of the doped overgrowth through one side of the structure 100C, opposite to the side of the structure 100C that, once the substrate 102 has been removed, can also be contacted. The structure 100C is not shown to scale. However, in an example, the width of the channels/vias 124 is 500 nm. In further examples the size of structures is determined by the techniques used and structure that is desired, for example. For example, the crystal habit of the material used may determine the growth shape of the material proud surface of any masked layer. By etching through apertures that have been exposed in the masked layer a grid may be formed by growing n-type material in the channel/via 124. The doping level of the n-type region formed by n-type overgrowth 128 is less than that of the planar n-type region 104 that forms a part of the epitaxial structure 100A. Advantageously, a lower doping level aids the change in the space charge region in the n-type overgrowth 128 to vary at a faster rate with gate voltage, as described herein. In further examples, the doping level in the n-type overgrowth 128 is selected in order to provide light emission control at a predetermined rate.

Once an effective cathode provided by the n-type overgrowth 128 in the channels/vias 128 has been formed, an anode is provided based on p-type overgrowth formed in a further via 126. This is shown with respect to FIGS. 1D and FIG. 1E.

Figure 1D:
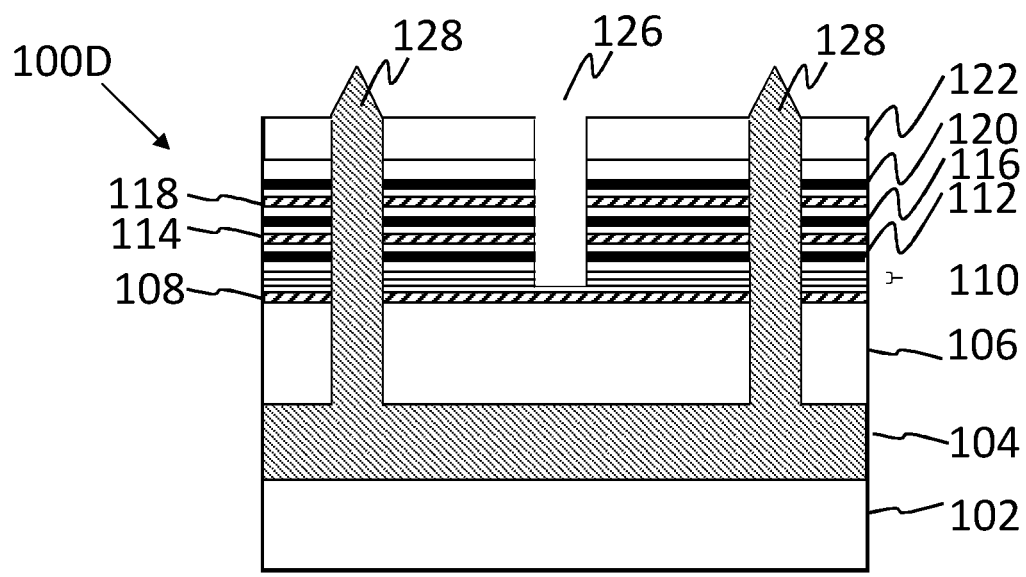
FIG. 1D shows a cross sectional view of the epitaxial structure of FIG. 1C that has been processed further.

FIG. 1D shows a cross sectional view of an epitaxial structure 100D that is the structure 100C of FIG. 1C that has been processed further. There is a further channel/via 126 that is a columnar channel/via 126 formed centrally within the pixel perimeter defined by the channel/via 124 with the n-type overgrowth 128 that has been formed through the light emitting regions 112, 116, 120. Additionally or alternatively, the further channel/via 126 is located at any suitable position in order to provide light emission. The cross sectional shape of the further channel/via 126 when seen in plan view is determined by the patterning and etching steps that are used in order to provide the further channel/via 126. The channel/via 126 has a width of approximately 500 nm. In further examples, the channel/via 126 has a width sized to meet preferred implementations regarding carrier injection and arrangement of pixels. The further channel/via 126 is achieved by depositing a further mask layer and selectively patterning the further mask layer in order to create apertures to expose the underlying structure and etching through the mask layer down to the active regions provided by the light emitting regions 112, 116, 120 using known lithographic and etching techniques.

Figure 1E:
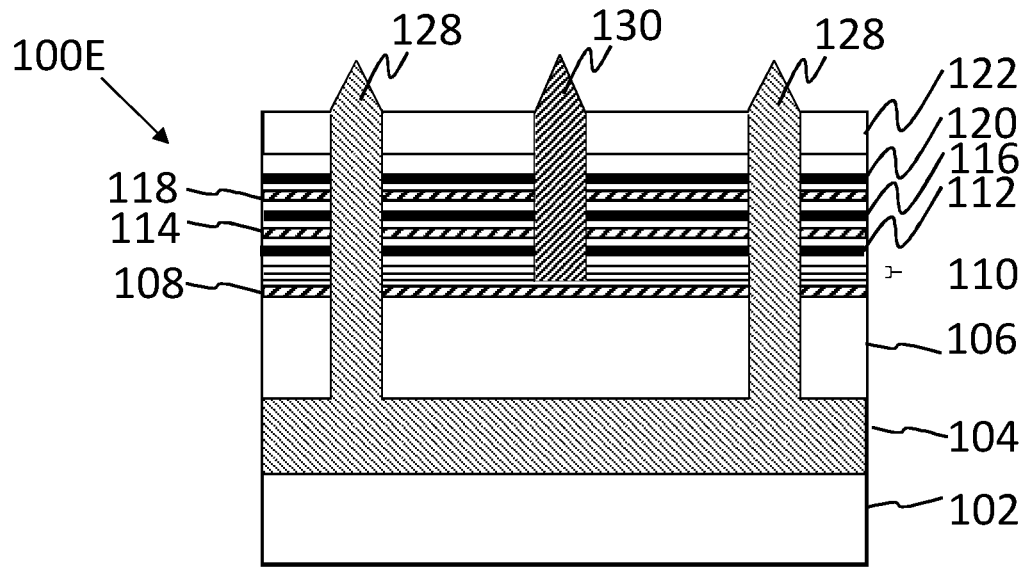
FIG. 1E shows a cross sectional view of the epitaxial structure of FIG. 1D that has been processed further.

The structure 100D of FIG. 1D is then processed further to provide the structure 100E of FIG. 1E, whereby p-type overgrowth is 130 is formed in the further channel/via 126. The p-type overgrowth 130 is formed of p-type doped GaN with a doping level of $3 \times 10^{18}$ at/cm$^3$. In further examples, different materials and/or different doping levels are used to provide a p-type region. Selective area growth of p-type overgrowth material is performed using a metalorganic chemical vapour deposition (MOCVD) reactor that uses relatively high temperatures. Such relatively high temperatures anneal defects and passivate any open MQW surface. No dangling bonds in the MQW perimeter are left after processing and hence no passivation is needed. Therefore, beneficially, much reduced non-radiative recombination is achieved in the light emitting regions 112, 116, 120. In further examples, p-type overgrowth is performed using a different techniques, such as MBE.

The n-type overgrowth 128, providing an n-type region, and the p-type overgrowth 130, providing a p-type region, enable carrier injection into the light emitting regions 112, 116, 120, as described herein. The n-type overgrowth 128 provides an effective cathode and the p-type overgrowth 130 provides an effective anode, thereby to allow lateral injection of carriers into the light emitting regions 112, 116, 120 when a suitable power source is used. Such lateral carrier injection in the light emitting regions 112, 116, 120 provides more efficient carrier injection, including more efficient hole injection, and hence more efficient light emission. The carrier injection into the light emitting regions 112, 116, 120 may be based on the carrier diffusion length of the carriers injected into the multiple quantum well structures of the light emitting regions 112, 116, 120 to provide light that can be emitted via a light emitting surface defined by the pixel perimeter formed by the n-type overgrowth 128 in the channels/vias 124 etched through the light emitting regions 112, 116, 120.

Advantageously, compared with known selective area growth techniques, only n-type and p-type regions may be overgrown. This eliminates issues associated with poor uniformity and composition pulling that is normally encountered when growing AlGaN and InGaN alloys on patterned surfaces.

Whilst channels/vias 124 forming trenches defining the light emitting surfaces of pixels by passing through the light emitting regions 112, 116, 120 of epitaxial structures is shown based on etching of epitaxial structures, in further examples, other techniques are used to form light emitting regions with channels/vias passing through them in order to define the perimeters of light emitting surfaces of pixels in an array of pixels.

Figure 1F:
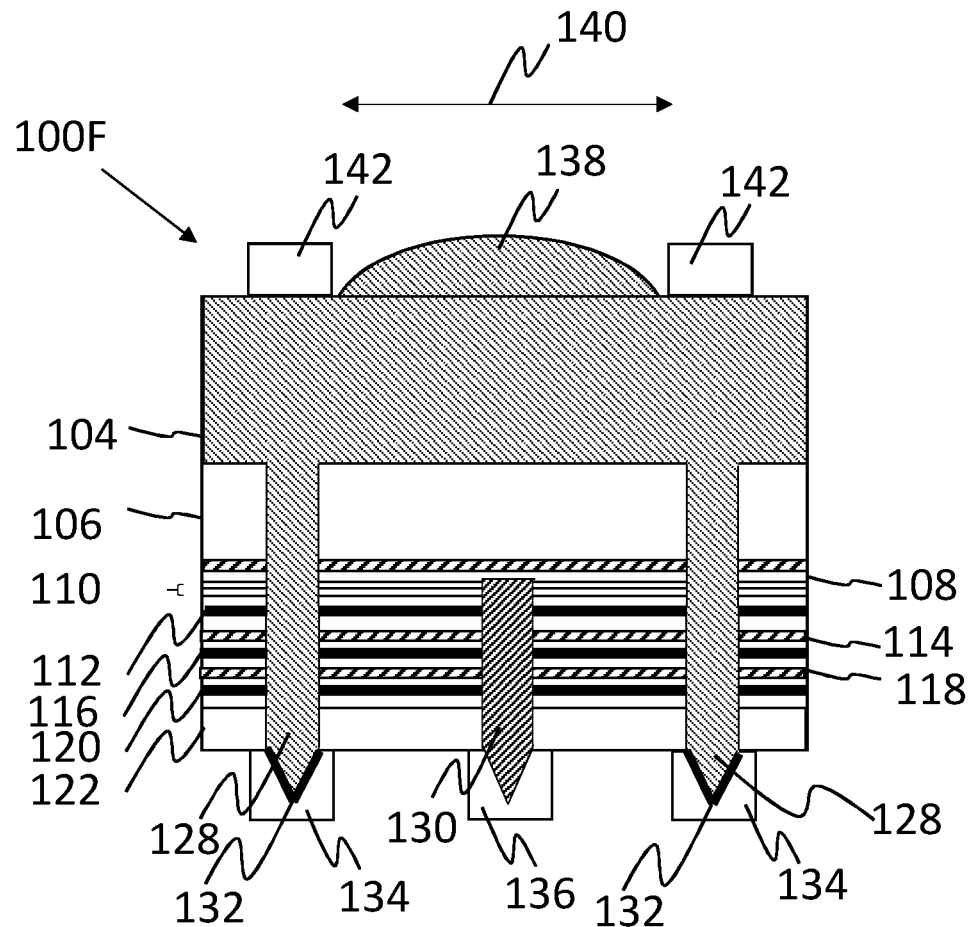
FIG. 1F shows a cross sectional view of the epitaxial structure of FIG. 1D that has been processed further.

FIG. 1F shows a cross-sectional view of a processed light emitting structure 100F as described with respect to FIGS. 1A to 1E. The processed light emitting structure 100F is provided by flipping the light emitting structure of FIG. 1E in order to extract light through the n-type region 104 (where the substrate 102 is removed) and thus avoid absorption due to the p-type contact 136 that is formed on the p-type overgrowth 130 in the further channel/via 126.

There is shown a gate contact 134 associated with the n-type overgrowth 128. The gate contact 134 comprises a dielectric region 132 between a conducting portion of the gate contact 134 and the n-type overgrowth 128 in the channels/vias 124 formed through the light emitting regions 112, 116, 120. The gate contact 134 forms a metal-insulator-semiconductor contact as part of an effective metal-insulator-semiconductor field effect transistor (MIS-FET).

Figure 2:
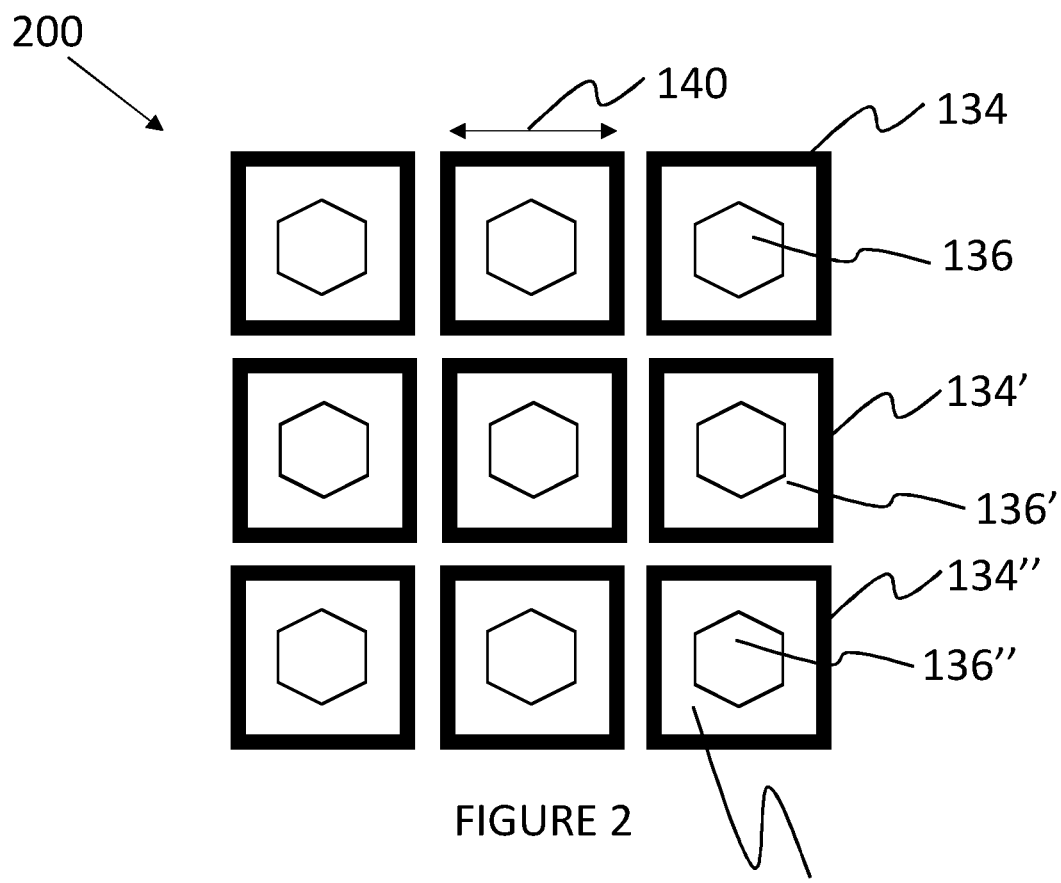
FIG. 2 shows a plan view of an array of light emitting devices.

The gate contact 134 is formed as a ring contact in a shape around the perimeter of a pixel associated with the p-type overgrowth 130, where the ring contact follows a grid defined by the channel/via 124 for n-type overgrowth to provide an n-type region through the light emitting regions 112, 116, 120 of the structure 100A. This is shown at FIG. 2. FIG. 2 shows a plan view 200 of the metal-insulator-semiconductor gate contact 134 and the ohmic anode p-type contact 136. The pattern is repeated in an array. There are shown nine light emitting pixels 202 in the example of FIG. 2, however, the array may be formed of any number of light emitting pixels 202. The light emitting pixels 202 are shown with a width dimension 140 associated with the distance between the channels/vias 124 around a further central channel/via 126 (and hence the plan view 200 is effectively of the underside of the light emitting pixels 202, opposite the light emitting surface 128 described with respect to FIG. 1F. Whilst the ring gate contact 134 is shown as a square shape associated with square shaped light emitting pixels, in further examples, the gate contact 134 takes any suitable shape associated with the light emitting pixels to which they are associated.

Further, FIG. 1F shows the insulating dielectric layer 122. The insulating dielectric layer 122 insulates the n-type overgrowth 128 such from any connections used to contact the p-type overgrowth 130. Preferably, the insulating layer 122 is silicon dioxide. There is shown an ohmic p-type contact 136 to which the anode of each pixel having a cross sectional dimension 140, that is to be addressed, is connected. In further examples, additional and/or alternative layers are included. In an example, there is provided a mirror/barrier layer configured to reflect light emitted from the light emitting regions 112, 116, 120 out of a light emitting surface 138 defined by the n-type overgrowth 128 in the channels/vias 124 defining the perimeter of the pixels. Advantageously, the ohmic p-type contact 136 may be connected to a backplane such that a p-type contact 136 for each pixel in an array is contacted and independently addressable.

There is shown a metal grid 142 designed to provide an ohmic contact to the common cathode n-type grid of the light emitting array. Such a metal grid 142 is aligned with respect to the n-type overgrowth 128 in the channels/vias 124 in order to maximise light extraction and thus when viewed in plan view may assume substantially the same form as the grid provided by the channels/vias 124 etched through the light emitting regions 112, 116, 120 of an epitaxial structure 100A. Advantageously, the ohmic cathode contact is on the opposite side of the structure 100F to the gate contact 134 and the ohmic anode p-type contact 136, thereby facilitating voltage control of carrier injection into the light emitting regions 112, 116, 120, whilst effectively using the limited space associated with pixels to increase light output.

A pixel formed with a perimeter associated with the n-type overgrowth 128 providing an n-type region has a dimension 140, which may be a width of a pixel and is shown in FIG. 1F. The light emitting surface 138 of the pixel (on the n-type region 104) is optionally patterned. In the example of FIG. 1F, the light emitting surface 138 is curved. In further examples, the light emitting surface is flat or patterned in any suitable manner and provides a surface through which light from the light emitting regions 112, 116, 120 exits the structure 100F.

Cathode contacts of the metal grid 142 are shown to provide electrical connections to the n-type region 104. The cathode contacts are ohmic metal contacts shown to follow the perimeter of their associated light emitting pixels in an analogous manner to the gate contact 134. However, in further examples, the cathode contacts take any suitable form and are formed from any suitable material. For example, the n-type region 104 provides a common electrode and is electrically connected in an appropriate manner. In further examples, transparent conducting materials, such as indium tin oxide (ITO) are used to provide a common electrode.

Whilst the above LED structures are described with reference to growth by MOCVD, growth by different and/or supplementary techniques is beneficial in some examples. For example, growth by MBE may enable cooler and/or slower growth rates which may have benefits in respect of the above described growth and processing steps. Whilst the above process steps are described in any order, the skilled person understands that in further examples the process steps are performed in any order that is suitable to obtain the target structure.

In order to provide control of the wavelength of light emitted by the light emitting structures described with respect to FIGS. 1 to 2, carrier injection by the p-type overgrowth 130 and the n-type region 128, by the anode and cathode contacts 136, 142 respectively, into the light emitting regions 112, 116, 120 is altered by the application of a voltage at the gate contact 134. This is illustrated at FIGS. 3 and 4.

Figure 3:
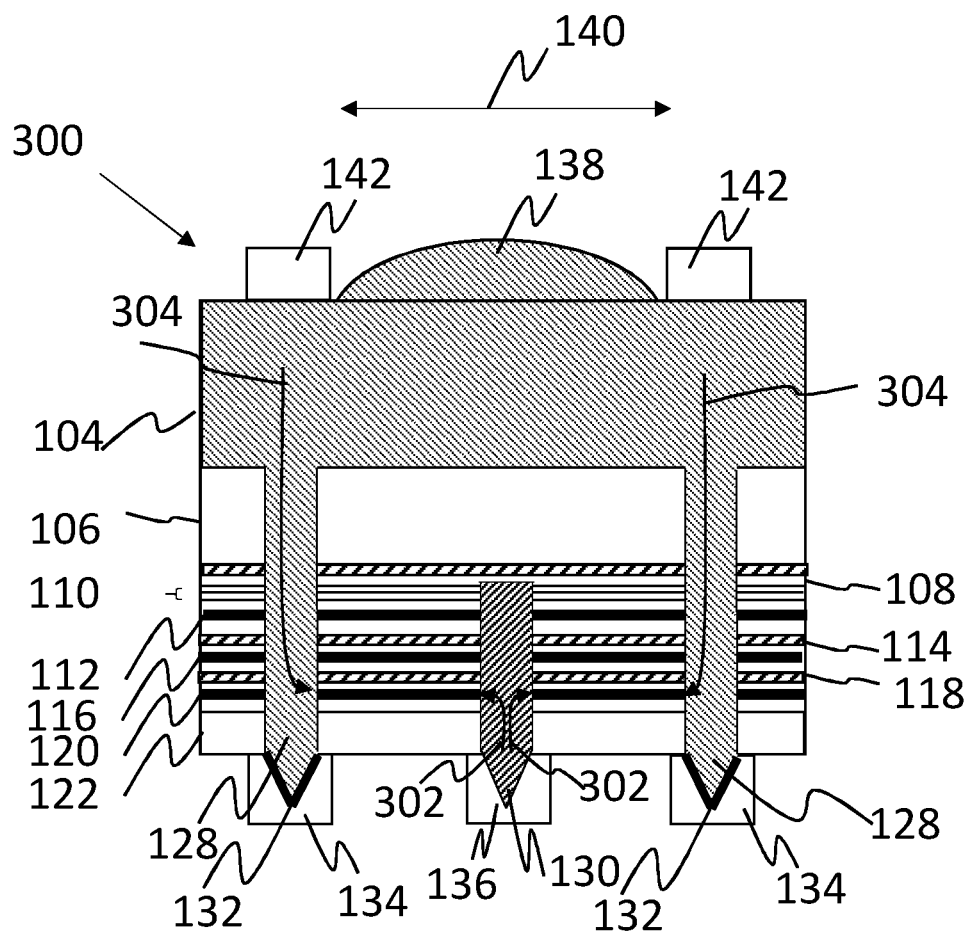
FIG. 3 shows a cross sectional view of carrier injection in the epitaxial structure of FIG. 1E.
Figure 4:
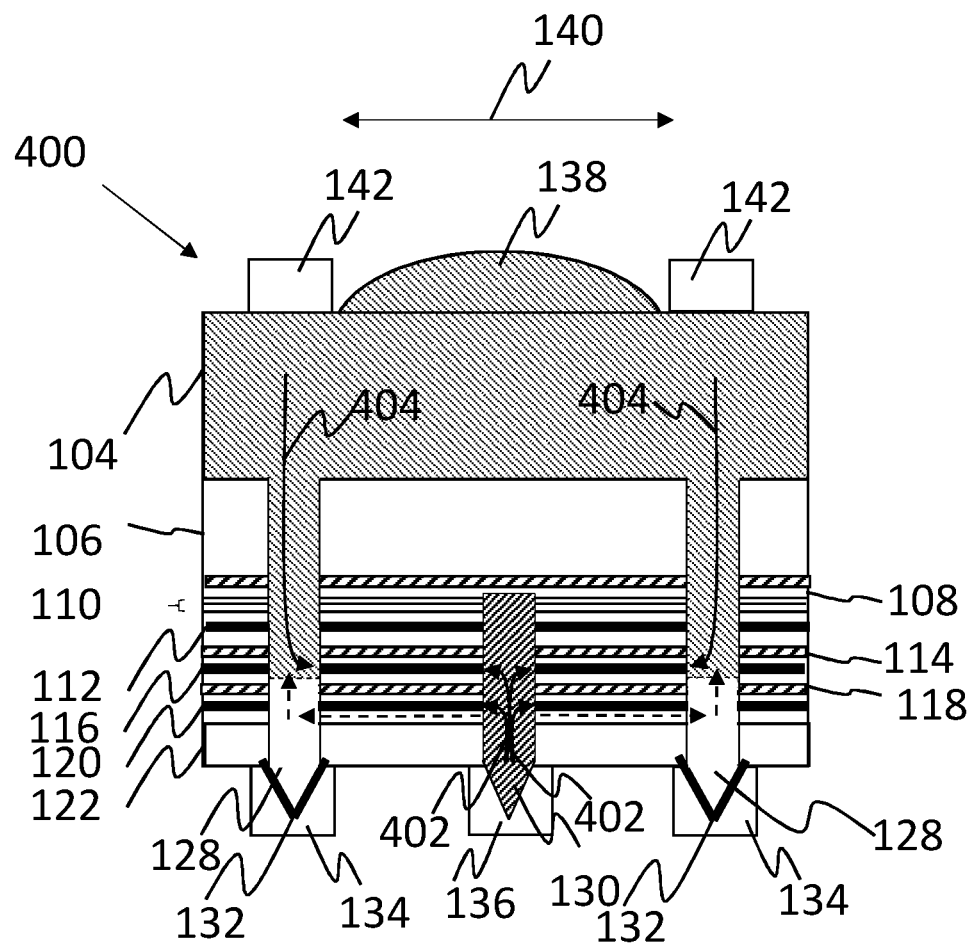
FIG. 4 shows a cross sectional view of carrier injection in the epitaxial structure of FIG. 1E.

FIG. 3 shows a light emitting diode device 300 with a first example of carrier injection into one of the light emitting regions 120. The arrows 302 show lateral carrier injection into the light emitting region 120 by the p-type overgrowth 130 and the further arrows 304 show lateral carrier injection into the light emitting region 120 by the n-type region. Upon altering the voltage at the gate contact 134, the carrier injection into the light emitting regions 112, 116, 120 is altered. This is shown in a second example of a light emitting diode device 400 at FIG. 4. FIG. 4 shows arrows 402 illustrating lateral carrier injection into the light emitting region 116 by the p-type overgrowth 130 and lateral carrier injection into the light emitting region 116 by the n-type region (shown by arrows 404). The change in carrier injection is provided by the application of a negative voltage applied to the gate contact 134, whereby the negative voltage is lower than the cathode metal grid 142 voltage. The gate voltage depletes electrons from the cathode pillar formed by the n-type overgrowth 128 pushing a space charge region deeper. Increasing the negative voltage further causes the space charge region to be pushed deeper and eventually result in carrier injection in the first light emitting region 112 instead of the second light emitting region 116. Therefore, gate voltage control enables the ratio of light emitted by the light emitting regions 112, 116, 120 to be controlled. Accordingly, where the n-type overgrowth 128 encircles the light emitting regions 112, 116, 120 of the active region of the light emitting diode device, the gate voltage controls the depletion depth of the via encircling the active region.

Advantageously, a pixel with a light emitting surface 138 emits a sequence of red-green-blue light as the gate voltage at the gate contact 134 becomes more negative and the electron current is pushed progressively deeper in the structure.

Whilst the structures described with respect to FIGS. 1 to 4 have an n-type region corresponding to the perimeter and a central p-type region, with a gate contact and cathode associated with the n-type region and an anode associated with the p-type region, in further examples the p-type region forms the perimeter of a pixel and has an anode and gate contact associated with it and the n-type region provides a central cathode contact. In such a complementary version, control of the gate voltage also alters lateral carrier injection and the wavelength of light that is emitted by the light emitting regions.

The structures described with respect to FIGS. 1 to 4 are implementable in arrays of monolithically grown native LEDs providing multicolour light output for pixels each capable of emitting light at different, voltage controllable, wavelengths. Such structures, advantageously, provide micro LED structures for high resolution light emitting displays.

Whilst the use of n-type and p-type material formed in channels through multiple, different wavelength, light emitting regions is used to provide pixels with light emitting surfaces defined by one of the n-type and p-type regions, thereby electrically isolating the pixels, in further examples, different arrangements of n-type regions and p-type regions passing through multiple, different wavelength, light emitting regions are used. Examples of different implementations are illustrated with respect to FIGS. 5 and 6.

Figure 5A:
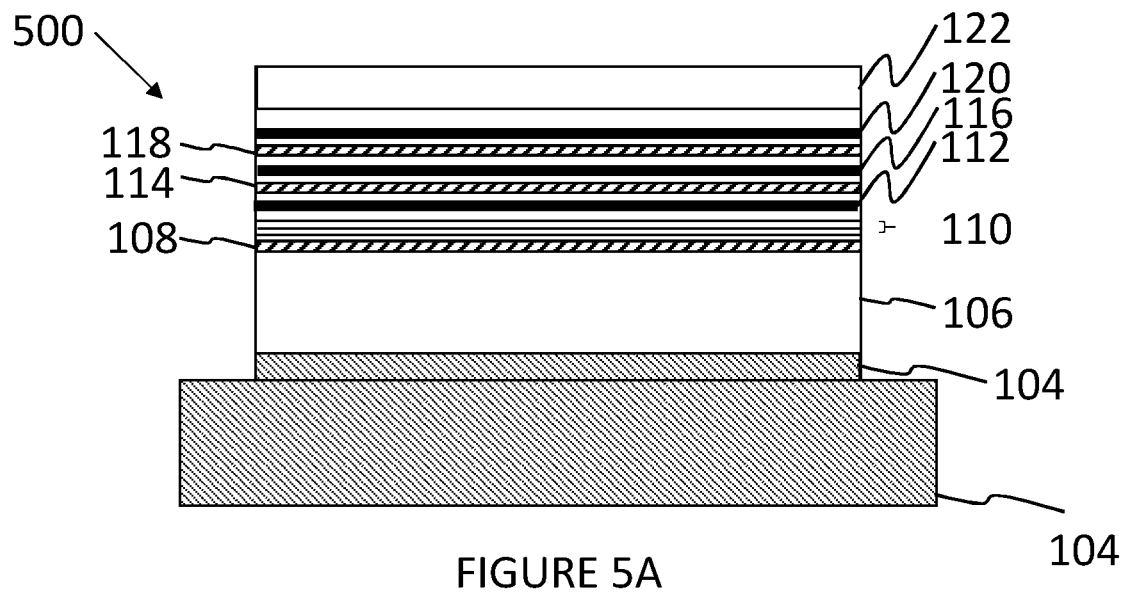
FIG. 5A shows a cross sectional view of a mesa formed in an epitaxial structure.
Figure 5B:
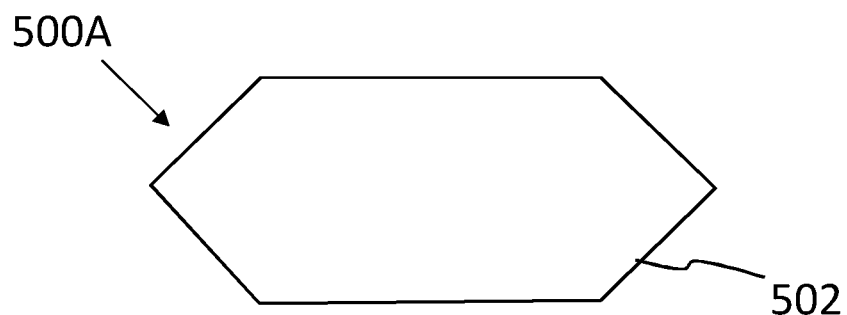
FIG. 5B shows a plan view of the mesa of FIG. 5A.
Figure 5C:
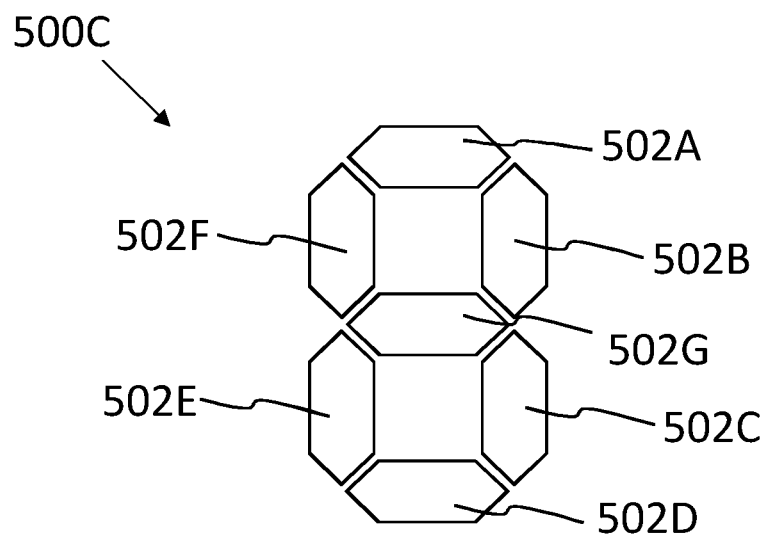
FIG. 5C shows a plan view of a symbol based display.

FIG. 5 shows an epitaxial structure that includes the layers described with respect to the epitaxial structure 100A of FIG. 1A. The epitaxial structure of FIG. 1A is shown to have been patterned and etched to provide a mesa 500 with a perimeter 502. The mesa 500 has a cross sectional shape such as that shown in the plan view 500A of FIG. 5B. The epitaxial structure 100A of FIG. 1A can be etched to provide numerous mesa, as shown at FIG. 5C, where the mesas 502A-502G are shown to provide a display. The provision of channels/vias in the mesas and subsequent overgrowth of p-type material and n-type material enables for light emitting structures to be formed that can be used to control the voltage in epitaxial stacks of monolithic native, multicolour LED layers in an analogous manner to that described with respect to FIGS. 1 to 4.

Figure 6A:
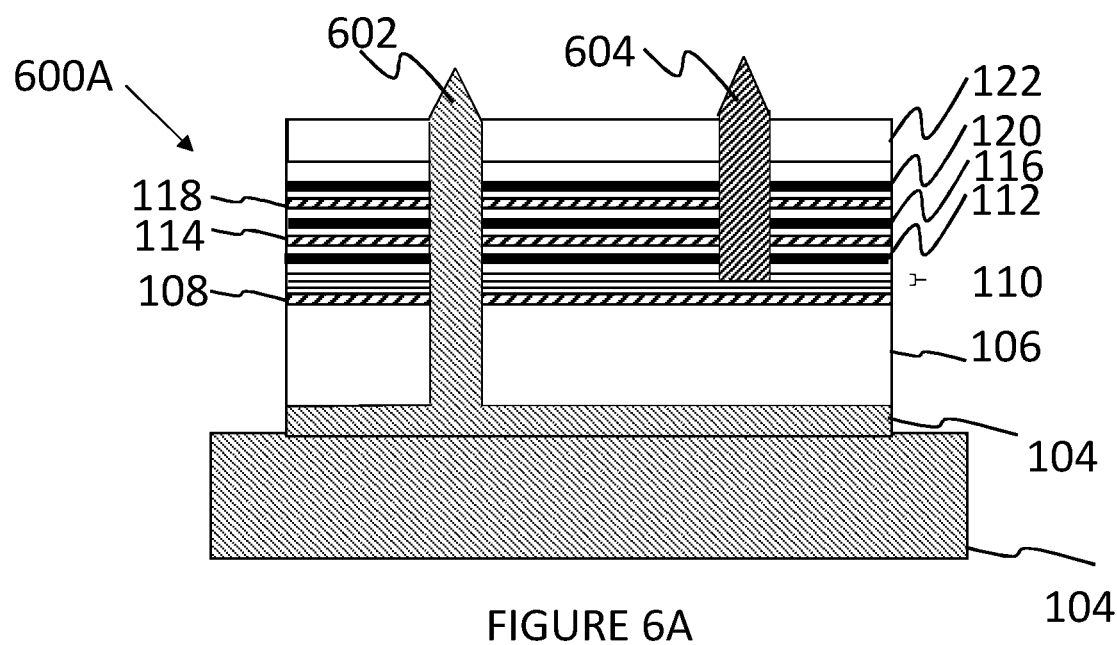
FIG. 6A shows a cross sectional view of the mesa of FIG. 5A that has been processed further.

FIG. 6A shows a cross sectional view of a structure 600A that is the mesa 500 structure of FIG. 5A that has been processed to provide an n-type region 602 in a channel through the light emitting regions 112, 116, 120 and an p-type region 604 in a channel through the light emitting regions 112, 116, 120. In the example of FIG. 6A, the n-type region 602 and the p-type region 604 passing through the light emitting regions 112, 116, 120 are formed in appropriate positions within the mesa, depending on the target light emission. However, in further examples, the p-type region 604 and the n-type region 602 are formed with any appropriate shape, size and location to provide target light emission.

For example, one of the p-type region 604 and the n-type region 602 forms the perimeter of the mesa structure. When suitable anode, cathode and gate contacts are formed, light emission can be controlled by altering the voltage applied to the gate contact in a manner analogous to that describe with respect to FIGS. 1 to 4.

Figure 6B:
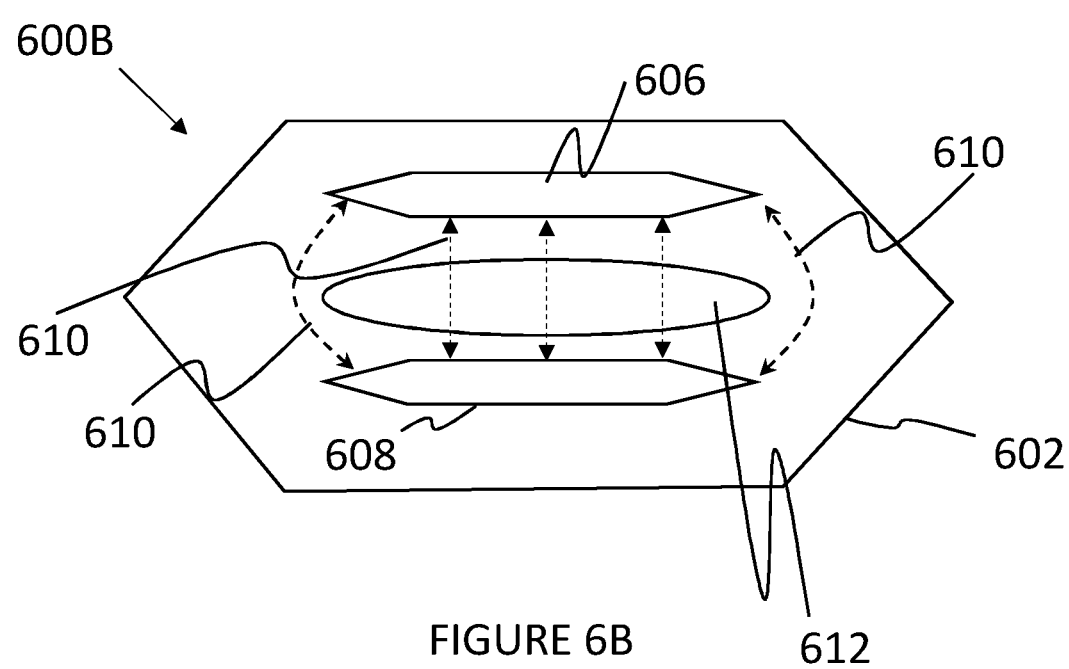
FIG. 6B shows a plan view of the processed mesa of FIG. 6A.

FIG. 6B shows a plan view 600B of an anode contact 606 associated with the p-type region 604 and a gate contact 608 comprising a dielectric region associated with the n-type region 602. A cathode contact is formed on the top or the bottom of the structure, as appropriate. Light emission is controlled in the region 612 between the p-type region 604 and the n-type region 602 by lateral carrier injection and emissive recombination in the light emitting regions 112, 116, 120 as shown by the arrows 610.

In further examples, the use of an n-type region 602 and a p-type region each passing through the light emitting regions 112, 116, 120 of an epitaxially grown structure such as structure 100A of FIG. 1A are used with appropriate anode, cathode and gate contacts to provide voltage controllable wavelength dependent light emission without forming mesas 500. In such an example, pairs of n-type and p-type regions passing through the light emitting regions are used such that each pair is sufficiently distanced to provide localised light emission in a controlled manner.

The invention claimed is:
1. A light emitting diode device comprising:
 a p-type region;
 an n-type region;
 a gate contact;
  a first light emitting region for recombination of carriers injectable by the p-type region and the n-type region; and
  a second light emitting region for recombination of carriers injectable by the p-type region and the n-type region, wherein the first light emitting region and the second light emitting region at least partially overlap to form a light emitting surface associated with the first light emitting region and the second light emitting region,
 wherein the p-type region is at least partially formed in a first channel through the first light emitting region and the second light emitting region, and the n-type region is at least partially formed in a second channel through the first light emitting region and the second light emitting region, wherein the light emitting diode device is configured such that the wavelength of light emitted by the light emitting surface is controllable by varying a gate voltage applied to one of the p-type and n-type regions by the gate contact thereby to alter carrier injection by the p-type and n-type regions into the first and second light emitting regions.

2. The light emitting diode device according to claim 1, comprising a third light emitting region that at least partially overlaps the first light emitting region and the second light emitting region to form the light emitting surface, wherein the p-type region is at least partially formed in the first channel through the third light emitting region and the n-type region is at least partially formed in the second channel through the third light emitting region; wherein the light emitting diode device diode is configured such that the wavelength of light emitted by the light emitting surface is controllable by varying a gate voltage applied to at least one of the p-type and n-type regions by the gate contact thereby to alter carrier injection by the p-type and n-type regions into the first, second and third light emitting regions.

3. The light emitting diode device according to claim 1, wherein the first channel or the second channel is a via at least partially defining the perimeter of the light emitting surface.

4. The light emitting diode device according claim 1, wherein the light emitting diode devices is configured such that varying the gate voltage alters the depletion depth in the first channel or the second channel.

5. The light emitting diode device according to claim 1 comprising an epitaxial crystalline semiconductor structure, wherein at least one of the first, second and third light emitting regions comprises one or more epitaxial crystalline semiconductor layers, preferably wherein at least one of the first, second and third light emitting regions comprises at least one epitaxial quantum well layer.

6. The light emitting diode device according to claim 1, wherein p-type region and/or n-type region comprises a planar layer.

7. The light emitting diode device according to claim 1, wherein the gate contact is a ring contact corresponding to a pixel defined by the light emitting surface, preferably wherein the ring contact forms one of a polygon or circular shaped contact.

8. The light emitting diode device according to claim 1, wherein light emitted from the first light emitting region has a different primary peak wavelength compared with light emitted from the second light emitting region.

9. The light emitting diode device according to claim 1, wherein the first and the second light emitting regions are separated by an undoped region.

10. An array of light emitting diode devices comprising a plurality of light emitting diode devices according to claim 1.

11. The array of light emitting diode devices according to claim 10, comprising a plurality of pixels, wherein the pixels correspond to light emitting surface areas of light emitting diode devices.

12. The array of light emitting diode devices according to claim 11, wherein the p-type region or the n-type region of at least two of the plurality of light emitting diode devices is shared to form a common electrode.

13. The array of light emitting diode devices according to claim 12, wherein the common electrode is on an opposite side of the array to the gate contact.

14. A method of forming a light emitting diode device comprising:
a p-type region;
an n-type region;
a gate contact;
a first light emitting region for recombination of carriers injectable by the p-type region and the n-type region; and
a second light emitting region for recombination of carriers injectable by the p-type region and the n-type region, wherein the first light emitting region and the second light emitting region at least partially overlap to form a light emitting surface associated with the first light emitting region and the second light emitting region, the method comprising at least partially forming the p-type region in a first channel through the first light emitting region and the second light emitting region and at least partially forming the n-type region in a second channel through the first light emitting region and the second light emitting region, wherein the light emitting diode device is configured such that the wavelength of light emitted by the light emitting surface is controllable by varying a gate voltage applied to at least one of the p-type and n-type regions by the gate contact thereby to alter carrier injection by the p-type and n-type regions into the first and second light emitting regions.

15. The method according to claim 14, comprising forming a third light emitting region that at least partially overlaps the first light emitting region and the second light emitting region to form the light emitting surface, comprising at least partially forming the p-type region in the first channel through the third light emitting region and at least partially forming the n-type region in the second channel the third light emitting region; wherein the light emitting diode device is configured such that the wavelength of light emitted by the light emitting surface is controllable by varying a gate voltage applied to one of the p-type and n-type regions by the gate contact thereby to alter carrier injection by the p-type and n-type regions into the first, second and third light emitting regions.

16. The method according to claim 14, comprising forming the first channel or the second channel as a via that at least partially defines the perimeter of the light emitting surface.

17. The method according to claim 14 comprising forming an epitaxial crystalline semiconductor structure, wherein at least one of the first, second and third light emitting regions comprise one or more epitaxial crystalline semiconductor layers, preferably wherein at least one of the first, second and third light emitting regions comprises at least one epitaxial quantum well layer.

18. The method according to claim 14, comprising forming the p-type region or the n-type region as at least part of a common electrode.

19. The method according to claim 14, comprising forming the gate contact as a ring contact corresponding to a pixel defined by the light emitting surface, preferably wherein the ring contact forms one of a polygon or circular shaped contact.

20. The method according to claim 14, wherein light emitted from the first light emitting region has a different primary peak wavelength compared with light emitted from the second light emitting region.

21. The method according to claim 14, wherein the first and the second light emitting regions are separated by an undoped region.

22. A method of forming an array of light emitting diode devices comprising a plurality of light emitting diode devices according to claim 14.

23. The method of forming an array of light emitting diode devices according to claim 22, comprising forming a plurality of pixels, wherein the pixels correspond to light emitting surface areas of light emitting diode devices.

24. The method of forming an array of light emitting diode devices according to claim 23, wherein the p-type region or the n-type region of at least two of the plurality of light emitting diode devices is shared to form a common electrode.

25. The method of forming an array of light emitting diode devices according to claim 24 comprising forming the common electrode on opposite side of the array to the gate contact.

* * * * *